(12) United States Patent
Cheah et al.

(10) Patent No.: US 10,716,209 B2
(45) Date of Patent: Jul. 14, 2020

(54) FIBER WEAVE-SANDWICHED DIFFERENTIAL PAIR ROUTING TECHNIQUE

(71) Applicant: Intel Corporation, Santa Clara, CA (US)

(72) Inventors: Bok Eng Cheah, Bukit Gambir (MY); Eng Huat Goh, Penang (MY); Jackson Chung Peng Kong, Tanjung Tokong (MY); Khang Choong Yong, Puchong (MY); Min Suet Lim, Simpang Ampat (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/565,639

(22) Filed: Sep. 10, 2019

(65) Prior Publication Data

US 2020/0137886 A1      Apr. 30, 2020

(30) Foreign Application Priority Data

Oct. 29, 2018   (MY) ............................... 2018704002

(51) Int. Cl.
| | |
|---|---|
| *H05K 1/11* | (2006.01) |
| *H05K 3/40* | (2006.01) |
| *H05K 1/03* | (2006.01) |
| *H05K 3/46* | (2006.01) |

(52) U.S. Cl.
CPC .............. *H05K 1/036* (2013.01); *H05K 1/115* (2013.01); *H05K 3/4038* (2013.01); *H05K 3/4673* (2013.01); *H05K 2201/029* (2013.01); *H05K 2201/09563* (2013.01)

(58) Field of Classification Search
CPC ........ H05K 1/112; H05K 1/113; H05K 1/114; H05K 1/115; H05K 1/116; H05K 1/117; H05K 3/4061; H05K 3/4069; H05K 3/42; H05K 3/425; H05K 3/429
See application file for complete search history.

(56) References Cited

U.S. PATENT DOCUMENTS

| | | | |
|---|---|---|---|
| 6,280,641 B1 * | 8/2001 | Gaku .................... | H05K 3/0035 216/17 |
| 6,400,573 B1 * | 6/2002 | Mowatt ............... | H01L 23/5383 174/252 |
| 6,623,663 B2 * | 9/2003 | Oshita ...................... | H01B 1/22 106/1.13 |

* cited by examiner

*Primary Examiner* — Jeremy C Norris
(74) *Attorney, Agent, or Firm* — Schwegman Lundberg & Woessner, P.A.

(57) ABSTRACT

To overcome the problem of the fiber weave effect desynchronizing differential signals in a pair of traces of approximately the same length in a printed circuit board, the pair of traces can be routed to traverse largely parallel paths that are above one another in the printed circuit board. The material between the paths can include weaved fiber bundles. The material on opposite sides of the paths, surrounding the pair of traces and the weaved fiber bundles, can include resin-rich material. As a result, the pair of traces are directly adjacent to the same materials, which can allow signals in the traces to propagate at the same speed, and prevent desynchronization of differential signals traversing the paths. The path length difference associated with traversing to different depths can be compensated with a relatively small in-plane diagonal jog of one of the traces.

20 Claims, 4 Drawing Sheets

FIBER WEAVE-SANDWICHED DIFFERENTIAL PAIR ROUTING TECHNIQUE

PRIORITY

This patent application claims the benefit of priority to Malaysia Application Serial No. PI 2018704002, filed Oct. 29, 2018, which is incorporated by reference herein in its entirety.

FIELD OF THE DISCLOSURE

The present disclosure relates generally to electrical routing in a printed circuit board.

BACKGROUND OF THE DISCLOSURE

Fiberglass yarns, woven into a weave pattern, typically provide mechanical strength for a printed circuit board. The weave pattern is impregnated with an epoxy resin, which provides electrical insulation and adhesion for the printed circuit board.

The fiberglass yarns and the epoxy resin typically have different physical properties pertaining to electrical conductivity. For example, the fiberglass yarns and the epoxy resin can have different values of relative permittivity (Dk) and different values of loss tangent (also known as dissipation factor) (Df). These differing physical property values can lead to different speeds of signal propagation in the printed circuit board, depending on which materials are adjacent to a signal trace. For example, a signal in a trace routed mostly over fiberglass can travel slower than a signal in a trace routed mostly over resin.

The variation in signal speed as a function of adjacent material can lead to a problem known as the fiber weave effect. The fiber weave effect can desynchronize signals that are sent over two transmission lines of the same length if the transmission lines are positioned (on average) near different materials. For a printed circuit board that uses high-speed differential signal pairs, the fiber weave effect can desynchronize the two signals in the signal pair, and can introduce unwanted noise in determining when voltage changes occur in the differential signal pair.

There have been numerous attempts to mitigate the fiber weave effect. Some have the disadvantage of increasing the surface area or board footprint for a particular circuit. Some have the disadvantage of wasting particular areas on the printed circuit board. Some have the disadvantage of increasing cost, due to additional material processing steps or fabrication processing steps. Some have the disadvantage of limiting a bandwidth or preventing a scaling of the circuit. None are satisfactory.

Figure 1:
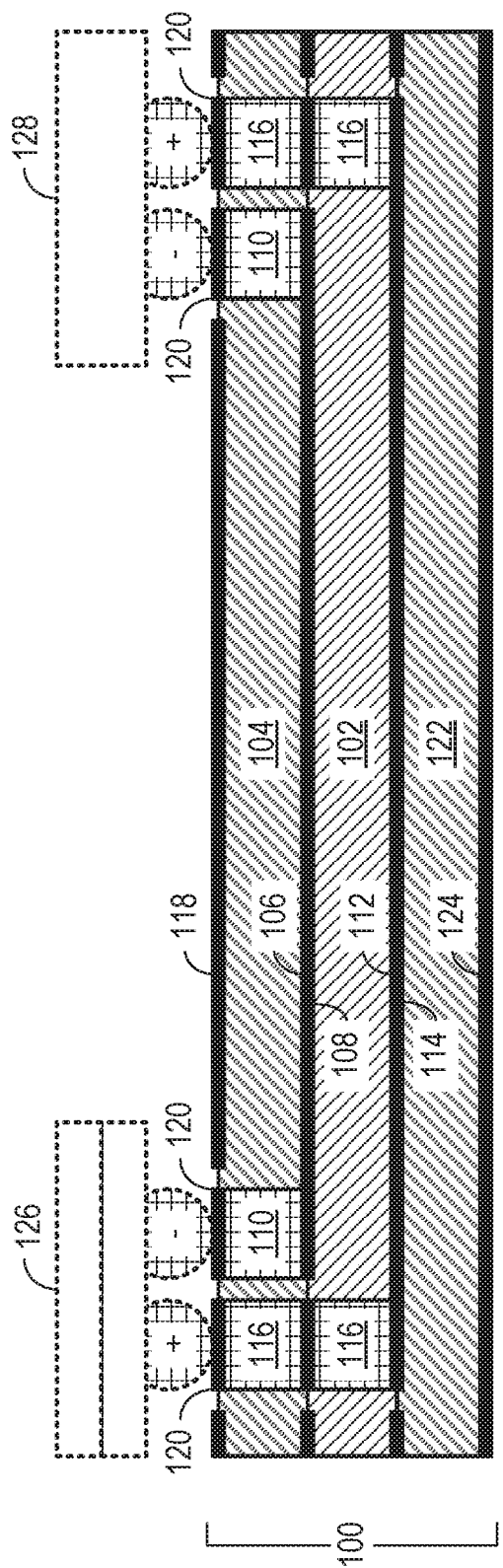
FIG. 1 shows a cross-sectional side view of an example of a printed circuit board, in accordance with some examples.

Corresponding reference characters indicate corresponding parts throughout the several views. Elements in the drawings are not necessarily drawn to scale. The configurations shown in the drawings are merely examples, and should not be construed as limiting the scope of the inventive subject matter in any manner.

DETAILED DESCRIPTION

To overcome the problem of the fiber weave effect desynchronizing differential signals in a pair of traces of approximately the same length in a printed circuit board, the pair of traces can be routed to traverse largely parallel paths that are above one another in the printed circuit board. The material between the paths can include weaved fiber bundles. The material on opposite sides of the paths, surrounding the pair of traces and the weaved fiber bundles, can include resin-rich material. As a result, the pair of traces are directly adjacent to the same materials, which can allow signals in the traces to propagate at the same speed, and prevent desynchronization of differential signals traversing the paths. The path length difference associated with traversing to different depths can be compensated with a relatively small in-plane diagonal jog of one of the traces.

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

FIG. 1 shows a cross-sectional side view of an example of a printed circuit board (PCB) 100, in accordance with some examples. The printed circuit board 100 is but one example of a printed circuit board; other configurations can also be used.

A central dielectric layer 102 can include at least one fiber that provides mechanical strength for the printed circuit board. In some examples, the central dielectric layer 102 can include at least one fiber formed from fabric, carbon, glass, fiberglass, or one or more other suitable materials. In some examples, the at least one fiber can be arranged in at least one bundle. In some examples, the bundles can be arranged in a weave pattern, which can be rectangular (e.g., having strands along one of two orthogonal directions), or can have another suitable shape. In some examples, the weave pattern can impregnated with a resin, which provides electrical insulation and adhesion for the printed circuit board. In some examples, the resin can be an epoxy resin. Other types of resin can also be used.

The central dielectric layer 102 can function as a structural element, upon which other elements of the printed circuit board 100 are formed. For example, holes drilled, etched, or ablated through the central dielectric layer 102 can be filled with an electrically conductive material to form vias, and additional layers can be deposited or grown on opposing sides of the central dielectric layer 102.

A top dielectric layer 104 can be disposed above the central dielectric layer 102. As explained above, directional terms, such as "above", "below", and the like, are used merely for convenience, and do not imply that any elements of the printed circuit board 100 are positioned with an absolute direction. In the directional convention used in this document, other dies, circuitry, or devices 126, 128 can electrically connect to a top side of the printed circuit board 100. The dies 126, 128 can form a system with the printed circuit board 100.

In some examples, the top dielectric layer 104 can be formed from a resin, such as an epoxy resin. In some examples, the top dielectric layer 104 can be formed to include only resin, such that the top dielectric layer 104 is uniform in its physical properties across the full top dielectric layer 104. In other examples, the top dielectric layer 104 can include one or more fiber bundles arranged in a weave pattern and impregnated with a resin material.

A top electrical trace layer 106 can be positioned between the central dielectric layer 102 and the top dielectric layer 104. The top electrical trace layer layer 106 can be patterned to form a top electrical trace 108 having longitudinal ends that electrically connect through the top dielectric layer 104 by electrically conductive vias 110. Because the patterning can be performed at the panel level, a single patterning operation can also be used to form additional elements in the top electrical trace layer 106.

A bottom electrical trace layer 112 can be positioned below the central dielectric layer 102. The bottom electrical trace layer 112 can be patterned to form a bottom electrical trace 114 having longitudinal ends that each electrically connect through the central dielectric layer 102 and the top dielectric layer 104 by electrically conductive vias 116. Because the patterning can be performed at the panel level, a single patterning operation can also be used to form additional elements in the bottom electrical trace layer 112.

A bottom dielectric layer 122 can be disposed beneath the central dielectric layer 102, such that the bottom electrical trace 114 can be positioned between the central dielectric layer 102 and the bottom dielectric layer 122. In some examples, the bottom dielectric layer 122 can be formed from a resin, such as an epoxy resin. In some examples, the bottom dielectric layer 122 can be formed to include only resin, such that the bottom dielectric layer 122 is uniform in its physical properties across the full bottom dielectric layer 122. In some examples, the bottom dielectric layer 122 can be formed from the same material used in the top dielectric layer 104. In other examples, the bottom dielectric layer 122 can include one or more fiber bundles arranged in a weave pattern and impregnated with a resin material.

There are several configurations in which the top dielectric layer 104 and the bottom dielectric layer 122 can help ensure that the material surrounding the top electrical trace 108 matches the material surrounding the bottom electrical trace 114.

In a first configuration, the top dielectric layer 104 and the bottom dielectric layer 122 can each include a resin that has different electrical physical properties than the at least one fiber in the central dielectric layer 102. In some of these examples, the top dielectric layer 104 and the bottom dielectric layer 122 can both be formed from the same resin or resin composite. In some of these examples, the top dielectric layer 104 and the bottom dielectric layer 122 can each lack a fiber. In some of these examples, the top dielectric layer 104, the central dielectric layer 102, and the bottom dielectric layer 122 can have a same thickness. In other examples, the top dielectric layer 104 and the bottom dielectric layer 122 can have a same thickness, which can differ from a thickness of the central dielectric layer 102.

In a second configuration, the top dielectric layer 104 and the bottom dielectric layer 122 can each include at least one fiber. In some examples, the fiber in these layer can be formed from the same material as in the fiber of the central dielectric layer 102. In some of these examples, the top dielectric layer 104 and the bottom dielectric layer 122 can each be thicker than the central dielectric layer by a multiplicative factor between 1.2 and 3, inclusive. Other multiplicative factor values can also be used, including greater than 1.2 but not necessarily less than 3, and others.

A top electrically conductive layer 118 can be disposed on top dielectric layer 104. The electrically conductive layer 118 can connect to a reference voltage, such as a ground (Vss) or a power (Vcc) reference voltage. The top electrically conductive layer 118 can be patterned to allow for electrical connections 120 to the electrically conductive vias 110, 116.

A bottom electrically conductive layer 124 can be disposed beneath the bottom dielectric layer 122. The bottom electrically conductive layer 124 can connect to a reference voltage, such as a ground (Vss) or a power (Vcc) reference voltage. In some examples, the reference voltage of the bottom electrically conductive layer 124 can match the reference voltage of the top electrically conductive layer 118. In other examples, the references voltages can differ.

At least a portion of the bottom electrical trace 114 can be parallel to and directly below at least a portion of the top electrical trace 108. By keeping the portion of the bottom electrical trace 114 directly below the portion of the top electrical trace 108, on opposite sides of the central dielectric layer 102, the two traces can symmetrically be located directly adjacent to the same materials in the central dielectric layer 102. For example, if one of the traces passes over a fiber bundle, then the other trace also passes over the fiber bundle. If one of the traces passes over a resin-filled area between the fiber bundles, then the other trace also passes over the resin-filled area. Because the traces are positioned symmetrically in this manner, the electrical signals in the traces can travel at the same speed, which is beneficial. Compared to more conventional configurations, such as two traces of a differential signal pair being positioned side-by-side on the same layer in the printed circuit board, the symmetric arrangement of FIG. 1 has the benefits of not having to explicitly keep track of where the fiber bundles are positioned in the printed circuit board, and not having to carefully position the electrical traces to coincide with the placement of the fiber bundles.

The printed circuit board 100 can form a first electrical path, having a first electrical path length, from a top of the top dielectric layer 104, through a via 110 to the top electrical trace 108, along the top electrical trace 108, and through a via 110 to the top of the top dielectric layer 104. The printed circuit board 100 can form a second electrical path, having a second electrical path length, from the top of the top dielectric layer 104, through vias 116 to the bottom electrical trace 114, along the bottom electrical trace 114, and through vias 116 to the top of the top dielectric layer 104. In some examples, the first and second electrical paths can have equal lengths to within +/−10/o, +/−5%, +/−1%, or to within any suitable tolerance. In some examples, the first and second electrical paths can electrically conduct two complementary electrical signals that form a differential signal pair. Because the first and second electrical paths have approximately equal lengths, and electrical signals traversing the first and second electrical paths propagate at the same speed, the signals in the differential signal pair can remain synchronized after traversing the first and second electrical paths.

The cross-sectional view of FIG. 1 shows that for the differential signal pair, the two electrical paths propagate to different depths in the printed circuit board 100, and, while at the different depths, traverse paths that are parallel and above one another. Because the propagation to different depths can create a difference in path length (e.g., equal to twice the thickness of the central dielectric layer 102), the electrical paths can additionally include an in-plane feature to compensate for the propagation mismatch due to the different depths. An example of such an in-plane feature is a diagonal jog traversed by one of the traces. An example of such a diagonal jog is shown in FIG. 2.

Figure 2:
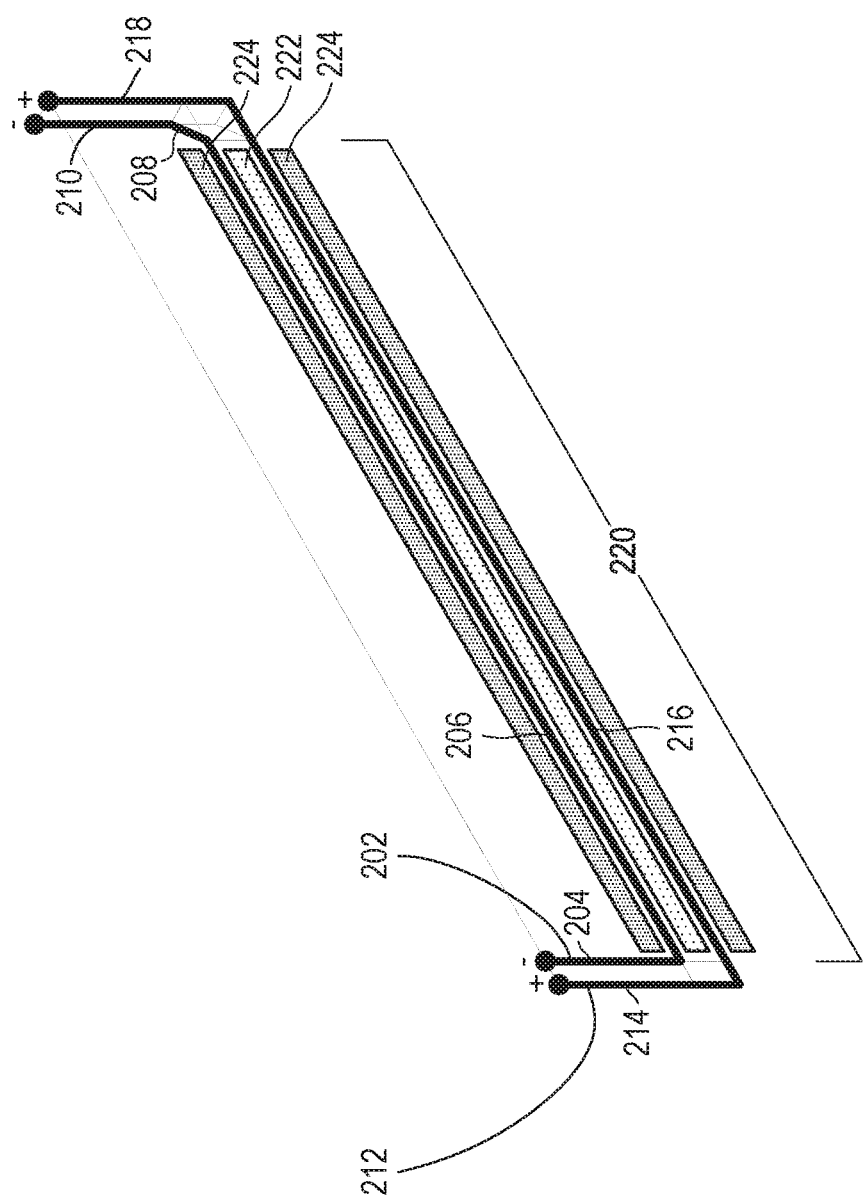
FIG. 2 shows a perspective view of an example of the first electrical path and the second electrical path, in accordance with some examples.

FIG. 2 shows a perspective view of an example of the first electrical path 202 and the second electrical path 212, in accordance with some examples. In some examples, the first electrical path 202 and the second electrical path 212 can be associated with two signals of a differential signal pair, which are designated by the symbols "+" and "−" in FIG. 2. It will be understood that the symbols "+" and "−" are mere symbols, and do not represent a polarity of any particular signals. The symbols "+" and "−" in FIG. 2 may alternatively be swapped.

The first electrical path 202, having a first electrical path length, can extend along subpaths 204, 206, 208, and 210. Subpath 204 can extend from a top of the top dielectric layer, through a via, to the top electrical trace. Subpath 206 can extend between opposing longitudinal ends of the top electrical trace. Although subpath 206 is shown as being straight, the subpath 206 can alternatively extend along a rectangular grid, in portions that align with one of the two orthogonal directions of the grid. Subpath 208 can include a diagonal jog, extending along a direction angled with respect to the orthogonal directions of the grid. The diagonal jog can be formed as a portion of the top electrical trace. Subpath 210 can extend from the end of the diagonal jog, through a via, to the top of the top dielectric layer.

The second electrical path 212, having a second electrical path length, can extend along subpaths 214, 216, and 218. Subpath 214 can extend from the top of the top dielectric layer, through vias, to the bottom electrical trace. Subpath 216 can extend between opposing longitudinal ends of the bottom electrical trace. Subpath 216 can be positioned below subpath 206 for most of its length, denoted by length 220 in FIG. 2. Although subpath 216 is shown as being straight, the subpath 216 can alternatively extend along a rectangular grid, in portions that align with one of the two orthogonal directions of the grid. Subpath 218 can extend from the bottom electrical trace, through vias, to the top of the top dielectric layer.

In some examples, it may be beneficial to orient the diagonal jog such that the first and second electrical path lengths are equal, or equal to within a specified tolerance, such as within 5%, within 10%, or within another suitable value. In some examples, the top electrical trace and the bottom electrical trace are positioned to route signals along a rectangular grid, at least one of the top electrical trace or the bottom electrical trace includes at least one diagonal jog that deviates from the grid, and the diagonal jog accounts for a thickness of the central dielectric layer in equalizing the first and second electrical paths. Ensuring that the first and second electrical path lengths are equal (to within a specified tolerance) can help ensure that the signals propagating along the first and second electrical paths spend the same length of time during propagation.

As explained above, in addition to forming the first and second electrical paths to have equal lengths (to within a specified tolerance), the first and second electrical paths are selected to lie above one another, specifically along length 220 in FIG. 2. Along subpaths 206 and 216, the material 222 of the central dielectric layer lies on one side of the subpath, and the material 224 lies on the opposite side of the subpath. The top and bottom dielectric layers can be formed from the same material 224. Orienting the subpaths 206 and 216 in this manner can help ensure that the signals propagating along the first and second electrical paths propagate at the same speed, which, in turn, can help ensure that the signals propagating along the first and second electrical paths spend the same length of time during propagation. In addition, orienting the subpaths 206 and 216 in this manner can also allow tight coupling and increased coupling surface area between the differential signal pair, which can reduce or minimize electrical losses.

Figure 3:
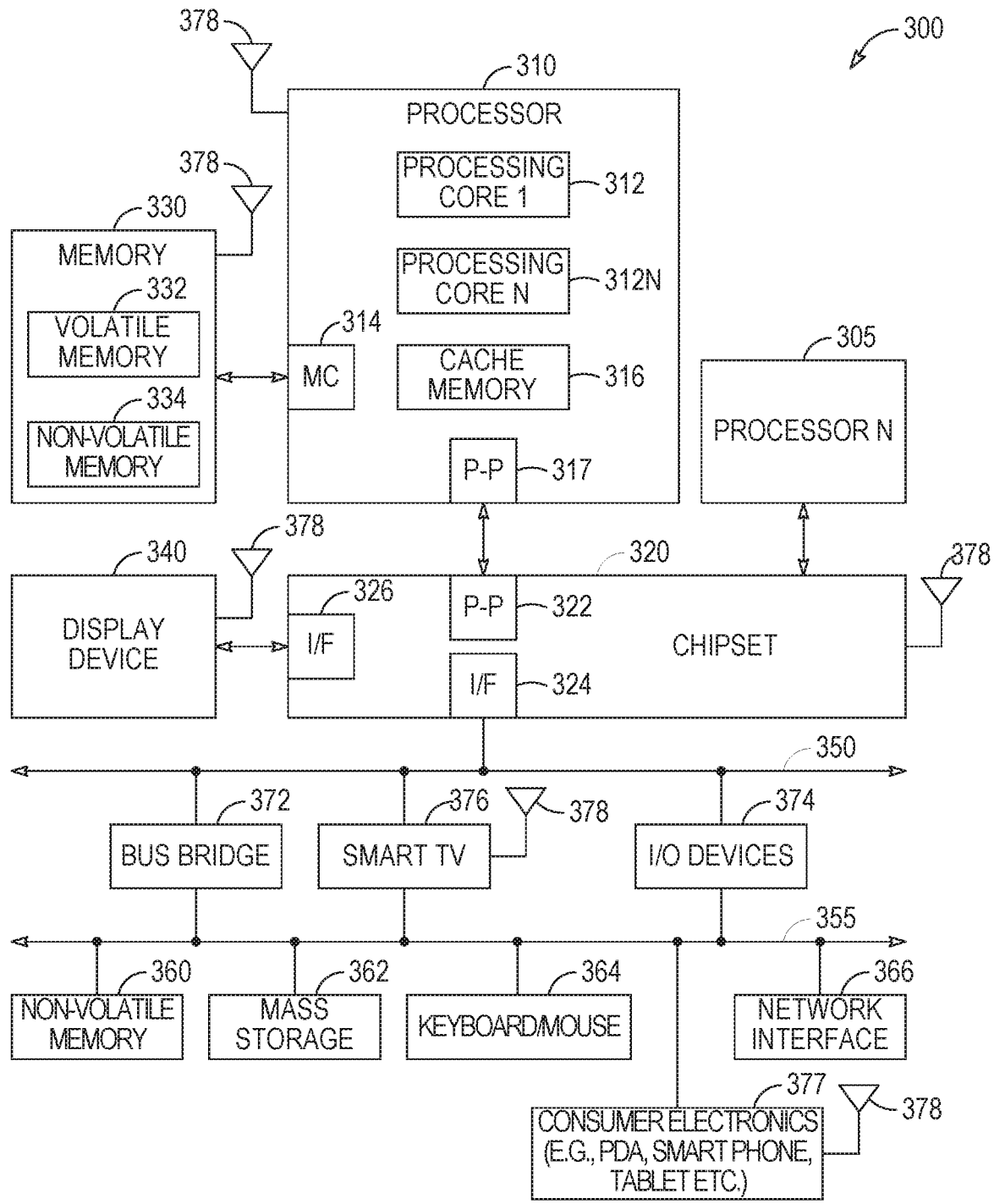
FIG. 3 illustrates a system level diagram, depicting an example of an electronic device (e.g., system) including the printed circuit board as described in the present disclosure.

FIG. 3 illustrates a system level diagram, depicting an example of an electronic device (e.g., system) including the printed circuit board as described in the present disclosure. FIG. 3 is included to show an example of a higher-level device application for the printed circuit board. In one embodiment, system 300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 300 is a system on a chip (SOC) system.

In one embodiment, processor 310 has one or more processor cores 312 and 312N, where 312N represents the Nth processor core inside processor 310 where N is a positive integer. In one embodiment, system 300 includes multiple processors including 310 and 305, where processor 305 has logic similar or identical to the logic of processor 310. In some embodiments, processing core 312 includes, but is not limited to, pre-fetch logic to fetch instructions, decode logic to decode the instructions, execution logic to execute instructions and the like. In some embodiments, processor 310 has a cache memory 316 to cache instructions and/or data for system 300. Cache memory 316 may be organized into a hierarchal structure including one or more levels of cache memory.

In some embodiments, processor 310 includes a memory controller 314, which is operable to perform functions that enable the processor 310 to access and communicate with memory 330 that includes a volatile memory 332 and/or a non-volatile memory 334. In some embodiments, processor 310 is coupled with memory 330 and chipset 320. Processor 310 may also be coupled to a wireless antenna 378 to communicate with any device configured to transmit and/or receive wireless signals. In one embodiment, an interface for wireless antenna 378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 332 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. Non-volatile memory 334 includes, but is not limited to, flash memory, phase change memory (PCM), read-only memory (ROM), electrically erasable programmable read-only memory (EEPROM), or any other type of non-volatile memory device.

Memory 330 stores information and instructions to be executed by processor 310. In one embodiment, memory 330 may also store temporary variables or other intermediate information while processor 310 is executing instructions. In the illustrated embodiment, chipset 320 connects with processor 310 via Point-to-Point (PtP or P-P) interfaces 317 and 322. Chipset 320 enables processor 310 to connect to other elements in system 300. In some embodiments of the example system, interfaces 317 and 322 operate in accordance with a PtP communication protocol such as the Intel® QuickPath Interconnect (QPI) or the like. In other embodiments, a different interconnect may be used.

In some embodiments, chipset 320 is operable to communicate with processor 310, 305N, display device 340, and other devices, including a bus bridge 372, a smart TV 376, I/O devices 374, nonvolatile memory 360, a storage medium (such as one or more mass storage devices) 362, a keyboard/mouse 364, a network interface 366, and various forms of consumer electronics 377 (such as a PDA, smart phone, tablet etc.), etc. In one embodiment, chipset 320 couples with these devices through an interface 324. Chipset 320 may also be coupled to a wireless antenna 378 to communicate with any device configured to transmit and/or receive wireless signals.

Chipset 320 connects to display device 340 via interface 326. Display 340 may be, for example, a liquid crystal display (LCD), a light emitting diode (LED) array, an organic light emitting diode (OLED) array, or any other form of visual display device. In some embodiments of the example system, processor 310 and chipset 320 are merged into a single SOC. In addition, chipset 320 connects to one or more buses 350 and 355 that interconnect various system elements, such as I/O devices 374, nonvolatile memory 360, storage medium 362, a keyboard/mouse 364, and network interface 366. Buses 350 and 355 may be interconnected together via a bus bridge 372.

In one embodiment, mass storage device 362 includes, but is not limited to, a solid-state drive, a hard disk drive, a universal serial bus flash memory drive, or any other form of computer data storage medium. In one embodiment, network interface 366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 3 are depicted as separate blocks within the system 300, the functions performed by some of these blocks may be integrated within a single semiconductor circuit or may be implemented using two or more separate integrated circuits. For example, although cache memory 316 is depicted as a separate block within processor 310, cache memory 316 (or selected aspects of 316) can be incorporated into processor core 312.

Figure 4:
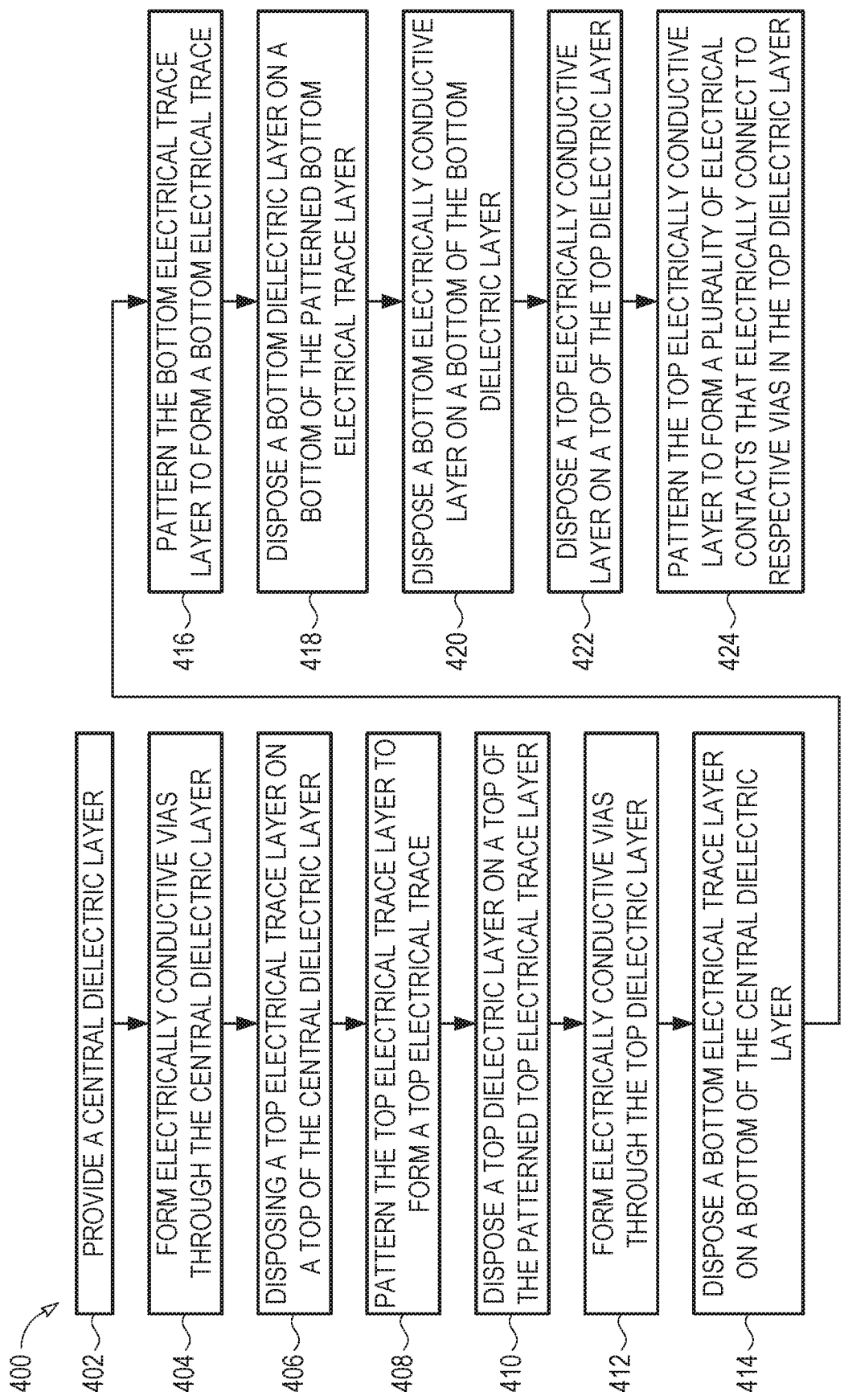
FIG. 4 shows a flowchart of an example of a method for manufacturing a printed circuit board, in accordance with some examples.

FIG. 4 shows a flowchart of an example of a method 400 for manufacturing a printed circuit board, in accordance with some examples. The method 400 can be executed to manufacture the printed circuit board of FIG. 1, in addition to other printed circuit boards. The method 400 is but one example of a method for manufacturing a printed circuit board; other suitable methods can also be used.

At operation 402, a central dielectric layer (such as 102 from FIG. 1) can be provided. The central dielectric layer can include at least one fiber that provides mechanical strength for the printed circuit board.

At operation 404, electrically conductive vias (such as 116) can be formed through the central dielectric layer.

At operation 406, a top electrical trace layer (such as 106) can be disposed on a top of the central dielectric layer.

At operation 408, the top electrical trace layer can be patterned to form a top electrical trace (such as 108).

At operation 410, a top dielectric layer (such as 104) can be disposed on a top of the patterned top electrical trace layer.

At operation 412, electrically conductive vias (such as 110) can be formed through the top dielectric layer, such that two of the electrically conductive vias (such as 110) electrically connect to respective longitudinal ends of the top electrical trace.

At operation 414, a bottom electrical trace layer (such as 112) can be disposed on a bottom of the central dielectric layer.

At operation 416, the bottom electrical trace layer can be patterned to form a bottom electrical trace (such as 114), such that at least a portion of the bottom electrical trace is parallel to and directly below at least a portion of the top electrical trace. The bottom electrical trace can have longitudinal ends that each electrically connect through the central and top dielectric layers by respective electrically conductive vias (such as 116) in the central and top dielectric layers.

At operation 418, a bottom dielectric layer (such as 122) can be disposed on a bottom of the patterned bottom electrical trace layer.

At operation 420, a bottom electrically conductive layer (such as 124) can be disposed on a bottom of the bottom dielectric layer. The bottom electrically conductive layer can form a voltage reference plane.

At operation 422, a top electrically conductive layer (such as 118) can be disposed on a top of the top dielectric layer. The top electrically conductive layer can form a voltage reference plane.

At operation 424, the top electrically conductive layer can be patterned to form a plurality of electrical contacts (such as 120) that electrically connect to respective vias (such as 110 and 116) in the top dielectric layer.

In the foregoing detailed description, the method and apparatus of the present disclosure have been described with reference to specific embodiments thereof. It will, however, be evident that various modifications and changes may be made thereto without departing from the broader spirit and scope of the present disclosure. The present specification and figures are accordingly to be regarded as illustrative rather than restrictive.

To further illustrate the device and related method disclosed herein, a non-limiting list of examples is provided below. Each of the following non-limiting examples can stand on its own, or can be combined in any permutation or combination with any one or more of the other examples.

In Example 1, a printed circuit board can include: a central dielectric layer including at least one fiber that provides mechanical strength for the printed circuit board; a top dielectric layer disposed above the central dielectric layer; a top electrical trace layer positioned between the central dielectric layer and the top dielectric layer, top electrical trace layer being patterned to form a top electrical trace having longitudinal ends that electrically connect through the top dielectric layer by electrically conductive vias; and a bottom electrical trace layer positioned below the central dielectric layer, the bottom electrical trace layer being patterned to form a bottom electrical trace having longitudinal ends that each electrically connect through the central and top dielectric layers by electrically conductive vias, at least a portion of the bottom electrical trace being parallel to and directly below at least a portion of the top electrical trace.

In Example 2, the printed circuit board of Example 1 can optionally be configured such that the printed circuit board forms a first electrical path, having a first electrical path length, from a top of the top dielectric layer, through a via to the top electrical trace, along the top electrical trace, and through a via to the top of the top dielectric layer; the printed circuit board forms a second electrical path, having a second electrical path length, from the top of the top dielectric layer, through vias to the bottom electrical trace, along the bottom electrical trace, and through vias to the top of the top dielectric layer; and the first and second electrical paths have equal lengths to within +/−10%.

In Example 3, the printed circuit board of any one of Examples 1-2 can optionally be configured such that the first and second electrical paths are configured to electrically conduct two complementary electrical signals that form a differential signal pair.

In Example 4, the printed circuit board of any one of Examples 1-3 can optionally be configured such that the top electrical trace and the bottom electrical trace are positioned to route signals along a rectangular grid; at least one of the top electrical trace or the bottom electrical trace includes at least one diagonal jog that deviates from the grid; and the diagonal jog accounts for a thickness of the central dielectric layer in equalizing the first and second electrical paths.

In Example 5, the printed circuit board of any one of Examples 1-4 can optionally be configured such that the top dielectric layer includes a resin that has different electrical physical properties than the at least one fiber; and the top dielectric layer lacks a fiber.

In Example 6, the printed circuit board of any one of Examples 1-5 can optionally be configured such that the top dielectric layer and the central dielectric layer have a same thickness.

In Example 7, the printed circuit board of any one of Examples 1-6 can optionally be configured such that the top dielectric layer includes at least one fiber; and the top dielectric layer is thicker than the central dielectric layer by a multiplicative factor greater than or equal to 1.2.

In Example 8, the printed circuit board of any one of Examples 1-7 can optionally be configured such that the multiplicative factor is between 1.2 and 3, inclusive.

In Example 9, the printed circuit board of any one of Examples 1-8 can optionally further include a top electrically conductive layer disposed on the top dielectric layer and configured to connect to a reference voltage, the top electrically conductive layer being patterned to allow for electrical connections to the electrically conductive vias.

In Example 10, the printed circuit board of any one of Examples 1-9 can optionally further include a bottom dielectric layer disposed beneath the central dielectric layer, such that the bottom electrical trace is positioned between the central dielectric layer and the bottom dielectric layer.

In Example 11, the printed circuit board of any one of Examples 1-10 can optionally be configured such that the bottom dielectric layer includes a resin that has different electrical physical properties than the at least one fiber; and the bottom dielectric layer lacks a fiber.

In Example 12, the printed circuit board of any one of Examples 1-11 can optionally be configured such that the bottom dielectric layer and the central dielectric layer have a same thickness.

In Example 13, the printed circuit board of any one of Examples 1-12 can optionally be configured such that the bottom dielectric layer includes at least one fiber; and the bottom dielectric layer is thicker than the central dielectric layer by a multiplicative factor greater than or equal to 1.2.

In Example 14, the printed circuit board of any one of Examples 1-13 can optionally be configured such that the multiplicative factor is between 1.2 and 3, inclusive.

In Example 15, the printed circuit board of any one of Examples 1-14 can optionally further include a bottom electrically conductive layer disposed beneath the bottom dielectric layer and configured to connect to a reference voltage.

In Example 16, a method for manufacturing a printed circuit board can include: providing a central dielectric layer, the central dielectric layer including at least one fiber that provides mechanical strength for the printed circuit board; forming electrically conductive vias through the central dielectric layer; disposing a top electrical trace layer on a top of the central dielectric layer; patterning the top electrical trace layer to form a top electrical trace; disposing a top dielectric layer on a top of the patterned top electrical trace layer; forming electrically conductive vias through the top dielectric layer, such that two of the electrically conductive vias electrically connect to respective longitudinal ends of the top electrical trace; disposing a bottom electrical trace layer on a bottom of the central dielectric layer; patterning the bottom electrical trace layer to form a bottom electrical trace, such that at least a portion of the bottom electrical trace is parallel to and directly below at least a portion of the top electrical trace, the bottom electrical trace having longitudinal ends that each electrically connect through the central and top dielectric layers by respective electrically conductive vias in the central and top dielectric layers; disposing a bottom dielectric layer on a bottom of the patterned bottom electrical trace layer; disposing a bottom electrically conductive layer on a bottom of the bottom dielectric layer, the bottom electrically conductive layer configured to form a voltage reference plane; disposing a top electrically conductive layer on a top of the top dielectric layer, the top electrically conductive layer configured to form a voltage reference plane; and patterning the top electrically conductive layer to form a plurality of electrical contacts that electrically connect to respective vias in the top dielectric layer.

In Example 17, the method of Example 16 can optionally be configured such that: the printed circuit board forms a first electrical path, having a first electrical path length, from a top of the top dielectric layer, through a via to the top electrical trace, along the top electrical trace, and through a via to the top of the top dielectric layer; the printed circuit board forms a second electrical path, having a second electrical path length, from the top of the top dielectric layer, through vias to the bottom electrical trace, along the bottom electrical trace, and through vias to the top of the top dielectric layer; and the first and second electrical paths have equal lengths to within +/−10%.

In Example 18, a system can include: a central dielectric layer including at least one fiber that provides mechanical strength for the printed circuit board; a top dielectric layer disposed above the central dielectric layer; a top electrical trace layer positioned between the central dielectric layer and the top dielectric layer, top electrical trace layer being patterned to form a top electrical trace having longitudinal ends that electrically connect through the top dielectric layer by electrically conductive vias; and a bottom dielectric layer disposed beneath the central dielectric layer; and a bottom electrical trace layer positioned between the central dielectric layer and the bottom dielectric layer, the bottom electrical trace layer being patterned to form a bottom electrical trace having longitudinal ends that electrically connect through the central and top dielectric layers by electrically conductive vias, at least a portion of the bottom electrical trace being parallel to and directly below at least a portion of the top electrical trace; wherein: the printed circuit board forms a first electrical path, having a first electrical path length, from a top of the top dielectric layer, through a via to the top electrical trace, along the top electrical trace, and through a via to the top of the top dielectric layer; the printed circuit board forms a second electrical path, having a second electrical path length, from the top of the top dielectric layer, through vias to the bottom electrical trace, along the bottom electrical trace, and through vias to the top of the top dielectric layer; and the first and second electrical paths have equal lengths to within +/−5%; and further comprising a pair of devices electrically connected to each other through the printed circuit board via a differential signal pair that extends over the first and second electrical paths.

In Example 19, the system of Example 18 can optionally be configured such that the top and bottom dielectric layer each include a resin that has different electrical physical properties than the at least one fiber; the top and bottom dielectric layers each lack a fiber; and the top, central, and bottom dielectric layers have a same thickness.

In Example 20, the system of any one Examples 18-19 can optionally be configured such that the top and bottom dielectric layers each include at least one fiber; and the top and bottom dielectric layers are each thicker than the central dielectric layer by a multiplicative factor between 1.2 and 3, inclusive.

What is claimed is:

1. A printed circuit board, comprising:
   a central dielectric layer including at least one fiber that provides mechanical strength for the printed circuit board;
   a top dielectric layer disposed above the central dielectric layer;
   a top electrical trace layer positioned between the central dielectric layer and the top dielectric layer, top electrical trace layer being patterned to form a top electrical trace having longitudinal ends that electrically connect through the top dielectric layer by electrically conductive vias; and
   a bottom electrical trace layer positioned below the central dielectric layer, the bottom electrical trace layer being patterned to form a bottom electrical trace having longitudinal ends that each electrically connect through the central and top dielectric layers by electrically conductive vias, at least a portion of the bottom electrical trace being parallel to and directly below at least a portion of the top electrical trace.

2. The printed circuit board of claim 1, wherein:
   the printed circuit board forms a first electrical path, having a first electrical path length, from a top of the top dielectric layer, through a via to the top electrical trace, along the top electrical trace, and through a via to the top of the top dielectric layer;
   the printed circuit board forms a second electrical path, having a second electrical path length, from the top of the top dielectric layer, through vias to the bottom electrical trace, along the bottom electrical trace, and through vias to the top of the top dielectric layer; and
   the first and second electrical paths have equal lengths to within +/−10%.

3. The printed circuit board of claim 2, wherein the first and second electrical paths are configured to electrically conduct two complementary electrical signals that form a differential signal pair.

4. The printed circuit board of claim 2, wherein:
   the top electrical trace and the bottom electrical trace are positioned to route signals along a rectangular grid;
   at least one of the top electrical trace or the bottom electrical trace includes at least one diagonal jog that deviates from the grid; and
   the diagonal jog accounts for a thickness of the central dielectric layer in equalizing the first and second electrical paths.

5. The printed circuit board of claim 1, wherein:
   the top dielectric layer includes a resin that has different electrical physical properties than the at least one fiber; and
   the top dielectric layer lacks a fiber.

6. The printed circuit board of claim 5, wherein the top dielectric layer and the central dielectric layer have a same thickness.

7. The printed circuit board of claim 1, wherein:
   the top dielectric layer includes at least one fiber; and
   the top dielectric layer is thicker than the central dielectric layer by a multiplicative factor greater than or equal to 1.2.

8. The printed circuit board of claim 7, wherein the multiplicative factor is between 1.2 and 3, inclusive.

9. The printed circuit board of claim 1, further comprising a top electrically conductive layer disposed on the top dielectric layer and configured to connect to a reference voltage, the top electrically conductive layer being patterned to allow for electrical connections to the electrically conductive vias.

10. The printed circuit board of claim 1, further comprising a bottom dielectric layer disposed beneath the central dielectric layer, such that the bottom electrical trace is positioned between the central dielectric layer and the bottom dielectric layer.

11. The printed circuit board of claim 10, wherein:
   the bottom dielectric layer includes a resin that has different electrical physical properties than the at least one fiber; and
   the bottom dielectric layer lacks a fiber.

12. The printed circuit board of claim 11, wherein the bottom dielectric layer and the central dielectric layer have a same thickness.

13. The printed circuit board of claim 10, wherein:
   the bottom dielectric layer includes at least one fiber; and
   the bottom dielectric layer is thicker than the central dielectric layer by a multiplicative factor greater than or equal to 1.2.

14. The printed circuit board of claim 13, wherein the multiplicative factor is between 1.2 and 3, inclusive.

15. The printed circuit board of claim 10, further comprising a bottom electrically conductive layer disposed beneath the bottom dielectric layer and configured to connect to a reference voltage.

16. A method for manufacturing a printed circuit board, the method comprising:
   providing a central dielectric layer, the central dielectric layer including at least one fiber that provides mechanical strength for the printed circuit board;
   forming electrically conductive vias through the central dielectric layer;
   disposing a top electrical trace layer on a top of the central dielectric layer;

patterning the top electrical trace layer to form a top electrical trace;

disposing a top dielectric layer on a top of the patterned top electrical trace layer;

forming electrically conductive vias through the top dielectric layer, such that two of the electrically conductive vias electrically connect to respective longitudinal ends of the top electrical trace;

disposing a bottom electrical trace layer on a bottom of the central dielectric layer;

patterning the bottom electrical trace layer to form a bottom electrical trace, such that at least a portion of the bottom electrical trace is parallel to and directly below at least a portion of the top electrical trace, the bottom electrical trace having longitudinal ends that each electrically connect through the central and top dielectric layers by respective electrically conductive vias in the central and top dielectric layers;

disposing a bottom dielectric layer on a bottom of the patterned bottom electrical trace layer;

disposing a bottom electrically conductive layer on a bottom of the bottom dielectric layer, the bottom electrically conductive layer configured to form a voltage reference plane;

disposing a top electrically conductive layer on a top of the top dielectric layer, the top electrically conductive layer configured to form a voltage reference plane; and patterning the top electrically conductive layer to form a plurality of electrical contacts that electrically connect to respective vias in the top dielectric layer.

17. The method of claim 16, wherein:

the printed circuit board forms a first electrical path, having a first electrical path length, from a top of the top dielectric layer, through a via to the top electrical trace, along the top electrical trace, and through a via to the top of the top dielectric layer;

the printed circuit board forms a second electrical path, having a second electrical path length, from the top of the top dielectric layer, through vias to the bottom electrical trace, along the bottom electrical trace, and through vias to the top of the top dielectric layer; and the first and second electrical paths have equal lengths to within +/−10%.

18. A system, comprising:

a central dielectric layer including at least one fiber that provides mechanical strength for the printed circuit board;

a top dielectric layer disposed above the central dielectric layer;

a top electrical trace layer positioned between the central dielectric layer and the top dielectric layer, top electrical trace layer being patterned to form a top electrical trace having longitudinal ends that electrically connect through the top dielectric layer by electrically conductive vias;

a bottom dielectric layer disposed beneath the central dielectric layer; and a bottom electrical trace layer positioned between the central dielectric layer and the bottom dielectric layer, the bottom electrical trace layer being patterned to form a bottom electrical trace having longitudinal ends that electrically connect through the central and top dielectric layers by electrically conductive vias, at least a portion of the bottom electrical trace being parallel to and directly below at least a portion of the top electrical trace;

wherein:

the printed circuit board forms a first electrical path, having a first electrical path length, from a top of the top dielectric layer, through a via to the top electrical trace, along the top electrical trace, and through a via to the top of the top dielectric layer;

the printed circuit board forms a second electrical path, having a second electrical path length, from the top of the top dielectric layer, through vias to the bottom electrical trace, along the bottom electrical trace, and through vias to the top of the top dielectric layer; and the first and second electrical paths have equal lengths to within +/−5%; and further comprising a pair of devices electrically connected to each other through the printed circuit board via a differential signal pair that extends over the first and second electrical paths.

19. The system of claim 18, wherein:

the top and bottom dielectric layer each include a resin that has different electrical physical properties than the at least one fiber;

the top and bottom dielectric layers each lack a fiber; and the top, central, and bottom dielectric layers have a same thickness.

20. The system of claim 18, wherein:

the top and bottom dielectric layers each include at least one fiber; and the top and bottom dielectric layers are each thicker than the central dielectric layer by a multiplicative factor between 1.2 and 3, inclusive.

* * * * *